(12) United States Patent
Biswas

(10) Patent No.: US 11,502,659 B2
(45) Date of Patent: Nov. 15, 2022

(54) VOLTAGE GAIN AMPLIFIER FOR AUTOMOTIVE RADAR

(71) Applicant: STMicroelectronics International N.V., Geneva (CH)

(72) Inventor: Riju Biswas, Gautam Buddha Nagar (IN)

(73) Assignee: STMicroelectronics International N.V., Geneva (CH)

( * ) Notice: Subject to any disclaimer, the term of this patent is extended or adjusted under 35 U.S.C. 154(b) by 254 days.

(21) Appl. No.: 16/903,552

(22) Filed: Jun. 17, 2020

(65) Prior Publication Data

US 2021/0399705 A1    Dec. 23, 2021

(51) Int. Cl.
*H03G 3/30*    (2006.01)
*G01S 13/931*    (2020.01)
*H03F 3/45*    (2006.01)

(52) U.S. Cl.
CPC ......... *H03G 3/3036* (2013.01); *G01S 13/931* (2013.01); *H03F 3/4508* (2013.01); *H03F 2200/171* (2013.01); *H03F 2200/451* (2013.01); *H03G 2201/103* (2013.01); *H03G 2201/307* (2013.01)

(58) Field of Classification Search
CPC .................................................. H03G 3/3036
See application file for complete search history.

(56) References Cited

U.S. PATENT DOCUMENTS

| | | | | |
|---|---|---|---|---|
| 3,983,505 A | * | 9/1976 | Ishigaki | H03G 5/165 330/109 |
| 4,926,139 A | * | 5/1990 | Anderson | H04R 25/356 330/306 |
| 6,133,784 A | * | 10/2000 | Gregoire | G11B 5/035 |
| 6,771,124 B1 | * | 8/2004 | Ezell | H03G 1/0023 330/285 |
| 10,312,877 B2 | | 6/2019 | Matsuno et al. | |
| 2004/0189388 A1 | | 9/2004 | Nguyen et al. | |
| 2005/0258901 A1 | | 11/2005 | Khorramabadi | |
| 2006/0061415 A1 | | 3/2006 | Bhattacharjee et al. | |
| 2006/0284671 A1 | | 12/2006 | Ohba | |
| 2007/0188229 A1 | | 8/2007 | Abdelli | |
| 2013/0050013 A1 | | 2/2013 | Kobayashi et al. | |

(Continued)

FOREIGN PATENT DOCUMENTS

CN    110554389 A    12/2019
KR    20150060255 A    6/2015

OTHER PUBLICATIONS

EP Search Report and Written Opinion for family-related EP Appl. 2177943.4, report dated Feb. 24, 2022, 9 pages.

*Primary Examiner* — Patricia T Nguyen

(74) *Attorney, Agent, or Firm* — Crowe & Dunlevy

(57) ABSTRACT

Disclosed herein is a voltage gain amplifier for use in an automotive radar receiver chain. The voltage gain amplifier utilizes pole-zero cancelation to yield a desired transfer function without gain peaking at a bandwidth in which attenuation is desired, and utilizes a low pass filter effectively formed by a feedback loop including a high pass filter and a differential amplifier to ensure the desired level of attenuation at the desired bandwidth. In some instances, a chopper may be utilized in the feedback loop prior to the high pass filter, and after the differential amplifier, so as to reduce the bandwidth of the differential amplifier in the feedback loop.

26 Claims, 6 Drawing Sheets

(56) References Cited

U.S. PATENT DOCUMENTS

| | | |
|---|---|---|
| 2015/0171811 A1 | 6/2015 | Wu et al. |
| 2016/0020740 A1* | 1/2016 | Arcudia .................. H03G 5/28 |
| | | 330/261 |
| 2017/0272036 A1 | 9/2017 | Wu et al. |
| 2018/0262374 A1 | 9/2018 | Cheng et al. |
| 2019/0081604 A1 | 3/2019 | Thiagarajan et al. |
| 2019/0132163 A1 | 5/2019 | Ray |
| 2019/0312558 A1 | 10/2019 | Oku |
| 2020/0036383 A1* | 1/2020 | Connell .................. H03L 7/093 |
| 2020/0313638 A1* | 10/2020 | Hong ....................... H03F 1/26 |

\* cited by examiner

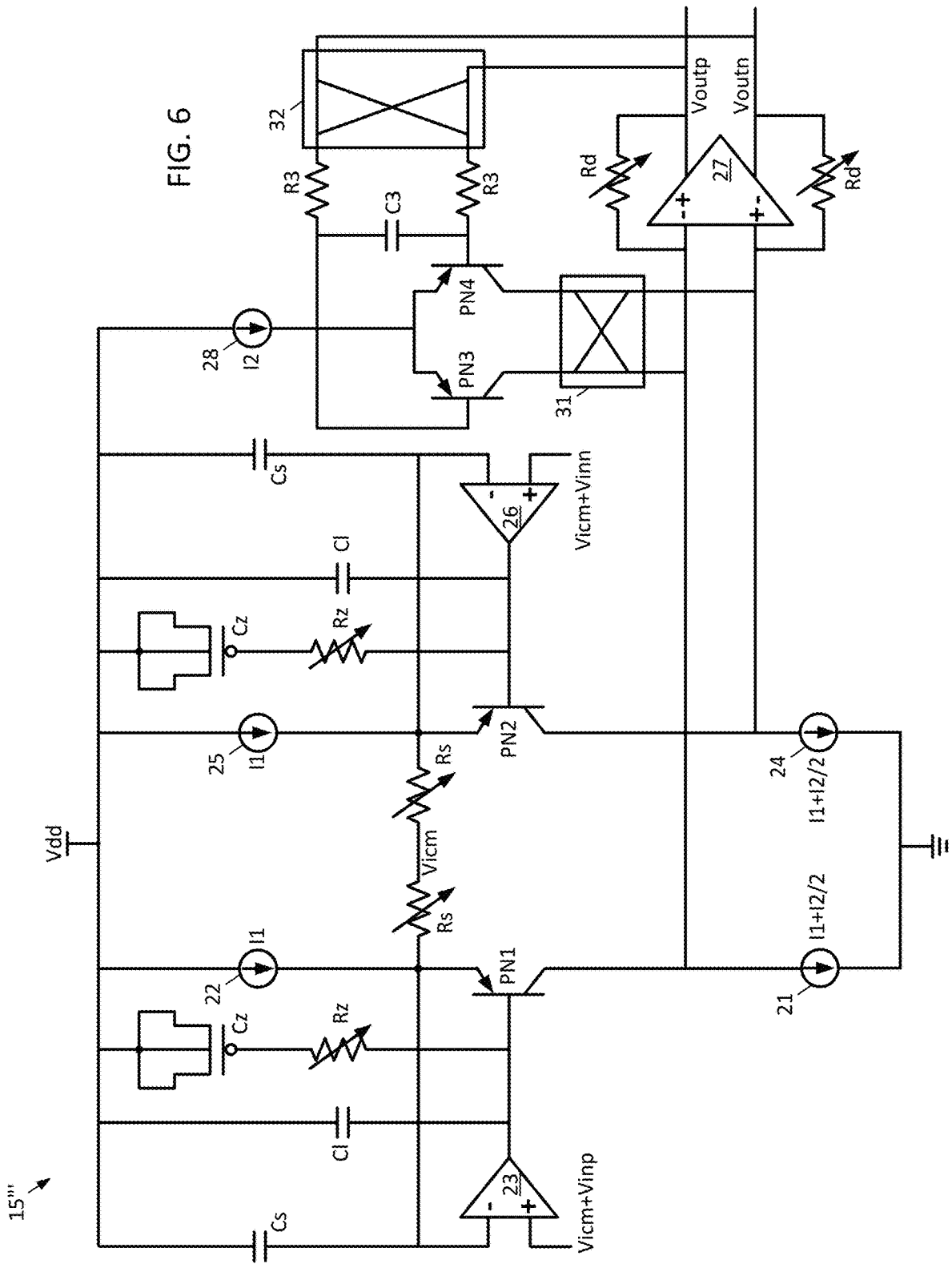

VOLTAGE GAIN AMPLIFIER FOR AUTOMOTIVE RADAR

TECHNICAL FIELD

This disclosure is related to the field of voltage gain amplifiers for use in the receiver chain of automotive radar devices and, in particular, to a voltage gain amplifier design that is capable of providing a desired level of attenuation in alias bands resulting from a given receiver chain configuration while avoiding issues of gain peaking.

BACKGROUND

Radar systems are now regularly used in driver assistance systems in automobiles, such as for determining the distance to other vehicles and objects near the vehicle that is utilizing the radar system. As one example, the cruise control systems of vehicles may utilize radar such that, in the absence of a nearby vehicle in front of the vehicle utilizing the radar system, a set speed is maintained by the vehicle utilizing the radar system, yet when a nearby vehicle is present in front of the vehicle utilizing the radar system, the vehicle utilizing the radar system slows down to maintain a set distance between itself and the nearby vehicle.

Such a radar system includes a transmit chain to transmit radio waves, and a receive chain to receive radio waves that have reflected off a nearby vehicle or object and returned to the vehicle employing the radar system. By analyzing the received radio waves, the distance to the nearby vehicle or object can be determined.

With reference to FIG. 1, a receive chain 10 for a vehicular radar system is now described. The receive chain 10 includes a mixer 11, which receives an input radiofrequency signal RX_IN from a radar wave receiver. This input radiofrequency signal RX_IN represents radar waves that have reflected off a target and returned to the receive chain 10.

A local oscillator output signal LO_IN is amplified by an amplifier 12, and the mixer 11 mixes the amplified local oscillator output signal LO_IN with the input radiofrequency signal RX_IN to produce a baseband signal. A high-pass filter 13 filters the baseband signal to attenuate the DC spur and outputs the baseband signal in differential form. The outputs of the high-pass filter 13 are the differential signals Vinp and Vinm, and each output also carries the input common mode voltage Vicm.

A voltage gain amplifier (VGA) 15 disclosed herein receives the differential input signal Vicm+Vinp at its non-inverting input terminal, and receives the differential input signal Vicm-Vinm at its inverting input terminal. The VGA 15 generates the output differential signals Voutp and Voutm, which are received as input by a second voltage gain amplifier (VGA 2) 24 that provides further amplification.

Note that the second VGA 24 may be of any design, and in some instances does not have the same structure and function as the VGA 15. Output of the second VGA 24 is received and filtered by the low-pass filter 16 to produce the output differential signals Vlpfp and Vlpfm, which are then converted to the digital domain by the analog to digital converter (ADC) 17. The digital signal output OUT from the ADC 17 can be used to determine the distance between the vehicle into which the receive chain 10 is integrated and nearby vehicles or objects.

In this example, the bandwidth of the intermediate frequency is approximately 25 MHz, and the ADC 17 driven by the VGA 15 is a 12 bit ADC, with a sampling frequency of 100 MHz. The result of the 25 MHz intermediate frequency bandwidth and the sampling frequency of 100 MHz is an alias band at 75 MHz-100 MHz. Therefore, attenuation of about 72 dB at 75 MHz-100 Mhz is desired in order to avoid inadvertently sampling a signal in the alias band.

The low-pass filter 16 is therefore designed to act as an anti-aliasing filter, and is placed after the second VGA 24 because, if the low-pass filter 16 were to be placed before the VGA 15, then noise introduced by the low-pass filter 16 would be amplified, which is undesirable. Therefore, signals in the alias band of 75 MHz-100 MHz are present at the input of the VGA 15, and these signals could saturate the VGA 15, drowning out the desired signal inside the intermediate frequency band.

As such, it is desired for the design of the VGA 15 to attenuate signals in the alias band. Attempts at creating VGAs that attenuate signals in the alias band have been made, but they suffer drawbacks. For example, gain peaking in the bandwidth in which attenuation is desired may occur, making the desired level of attenuation unattainable.

Therefore, further development is needed.

SUMMARY

Disclosed herein is a circuit (e.g., a voltage gain amplifier) including: an amplifier having an input receiving an input signal and generating an output signal at an output, wherein the output signal includes desirable low frequency components and undesirable high frequency components; a high-pass filter receiving the output signal and configured to filter out the desirable low frequency components and pass the undesirable high frequency components; and a transistor circuit coupled between the input of the amplifier and ground, wherein the transistor circuit is driven by the undesirable high frequency components of the output signal passed by the high-pass filter such that the transistor circuit removes those undesirable high frequency components from the input signal.

Also disclosed herein is a circuit including: an amplifier having an input receiving an input signal and generate an output signal at an output, wherein the output signal includes undesirable high frequency components; a first chopper configured receive the output signal and process the output signal, wherein the first chopper outputs a chopper output signal in which the undesirable high frequency components are downconverted to a lower frequency as well as upconverted to a higher frequency; a low-pass filter configured to pass the undesirable high frequency components that were downconverted to the lower frequency while filtering out the undesirable high frequency components that were upconverted to the higher frequency; a second chopper configured to upconvert the undesirable high frequency components that were downconverted to the lower frequency by the first chopper back to their original high frequency; and a transistor circuit coupled between the second chopper and ground, wherein the transistor circuit is driven by the downconverted undesirable high frequency components of the output signal passed by the low-pass filter such that the transistor circuit, through the second chopper, removes those upconverted undesirable high frequency components from the input signal.

BRIEF DESCRIPTION OF THE DRAWINGS

FIG. 6 is a schematic diagram of an embodiment of a voltage gain amplifier similar to that of FIG. 3, but with the NPN transistors replaced with PNP transistors.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Note that any resistors illustrated as adjustable resistors may be, for example, banks of selectable resistors, or may be adjustable by any other suitable fashion.

Figure 1:
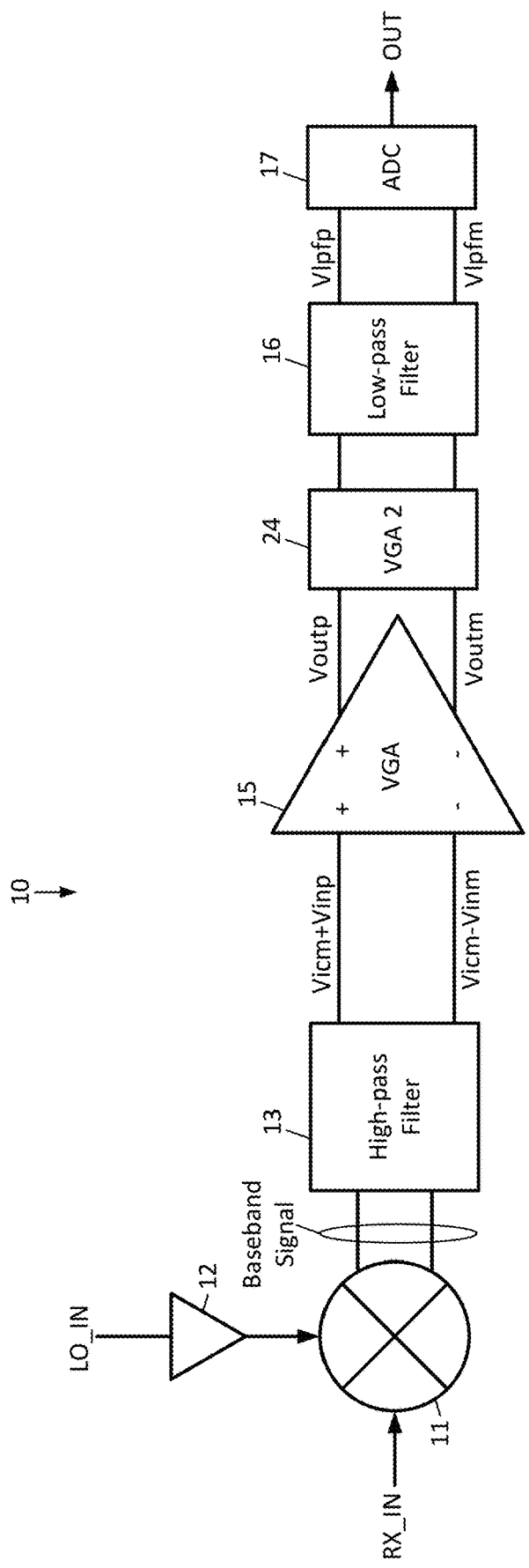
FIG. 1 is a block diagram of a receive chain of a known vehicular radar system including a voltage gain amplifier.
Figure 2:
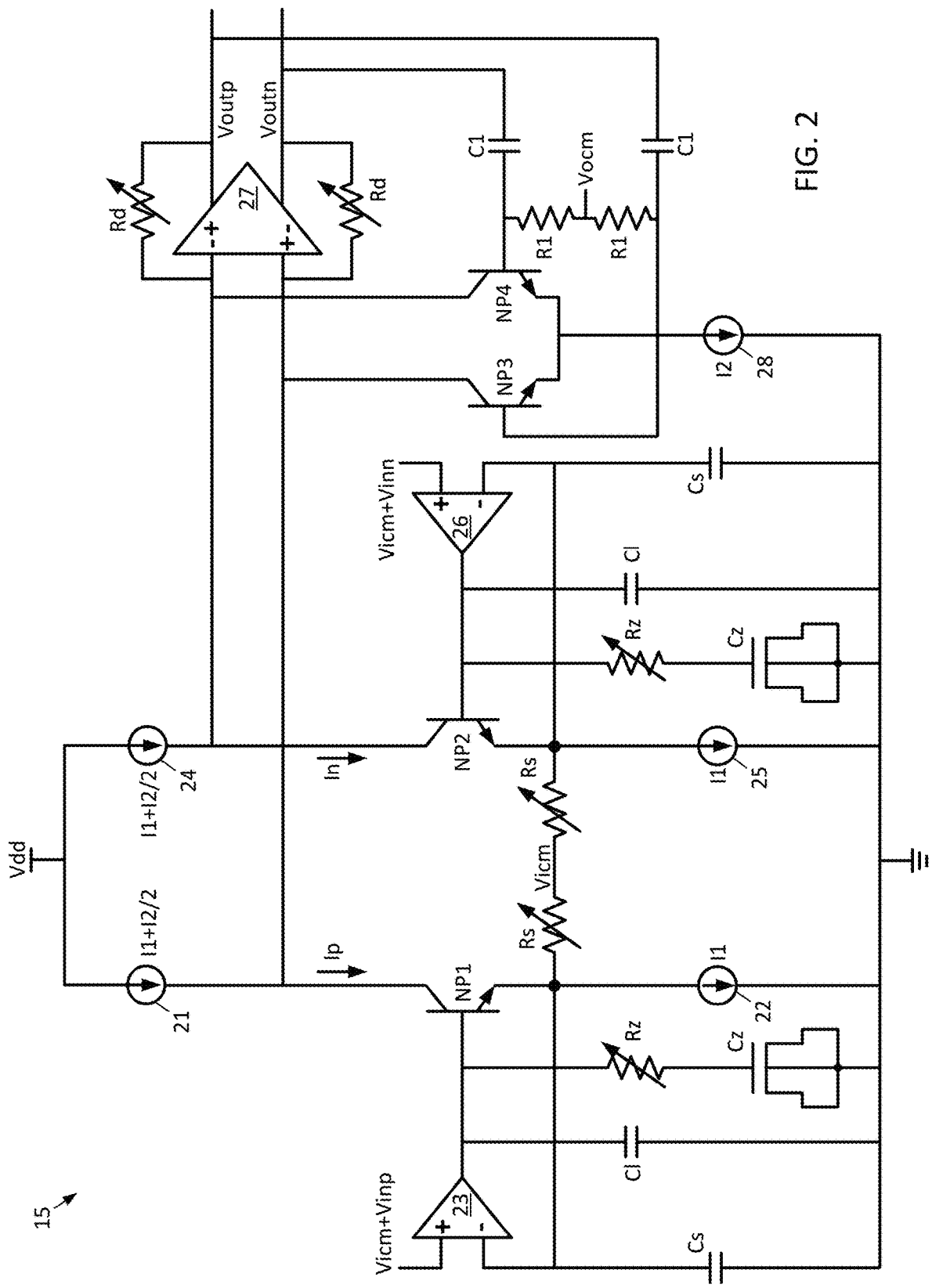
FIG. 2 is a schematic diagram of a voltage gain amplifier disclosed herein, such as may be used with the vehicular radar system of FIG. 1.

The structure and operation of a voltage gain amplifier (VGA) 15, such as may be used in the receive chain 1 of FIG. 1, is now described with initial reference to FIG. 2. In particular, the structure is first described, and thereafter, the operation will be described.

The VGA 15 is comprised of a differential pair of NPN bipolar junction transistors NP1 and NP2. A first amplifier 23 receives the differential input signal Vinp+Vicm at its non-inverting input, has its inverting input coupled to the emitter of the transistor NP1, and provides its output to the base of the transistor NP1. Similarly, a second amplifier 26 receives the differential input signal Vinm+Vicm at its non-inverting input, has its inverting input coupled to the emitter of the transistor NP2, and provides its output to the base of the transistor NP2. Two adjustable resistors Rs are coupled in series between the emitters of transistors NP1 and NP2, with an input common mode voltage Vicm being formed at the center tap between the resistors Rs. The DC gain of the VGA 15 is Rd/Rs, therefore the gain of the VGA 15 can be varied by varying Rs.

A current source 22 is coupled to the emitter of the transistor NP1 and sinks a current I1 therefrom. An adjustable resistor Rz and NMOS transistor configured as a capacitor Cz are coupled in series between the base of the transistor NP1 and ground, and a capacitor C1 is coupled between the base of the transistor NP1 and ground. A capacitor Cs (representing the input capacitance of the differential amplifier) is illustratively coupled between the inverting terminal of the amplifier 23 and ground. A current source 21 is coupled between the collector of the transistor NP1 and a supply voltage Vdd, and sources a current I1+I2/2. The capacitor C1 is utilized for stabilization of the amplifier 23.

Similarly, a current source 25 is coupled to the emitter of the transistor NP2 and also sinks the current I1 therefrom. An adjustable resistor Rz and NMOS transistor configured as a capacitor Cz are coupled in series between the base of the transistor NP2 and ground, and a capacitor C1 is coupled between the base of the transistor NP1 and ground. A capacitor Cs (representing the input capacitance of the differential amplifier) is illustratively coupled between the inverting terminal of the amplifier 26 and ground. A current source 24 is coupled between the collector of the transistor NP2 and the supply voltage Vdd, and sources the current I1+I2/2. The capacitor C1 is utilized for stabilization of the amplifier 26.

The VGA 15 also includes a second differential pair of NPN bipolar junction transistors NP3 and NP4. The emitters of transistors NP3 and NP4 are coupled to tail current source 28, which sinks a current I2 therefrom. The collector of the transistor NP3 is coupled to the collector of the transistor NP1 as well as to the non-inverting terminal of an amplifier 27. The base of the transistor NP3 is coupled through a capacitor C1 to the non-inverting output of the amplifier 27. The collector of the transistor NP4 is coupled to the collector of the transistor NP2 as well as to the inverting terminal of the amplifier 27 to receive the output voltage Voutp. The base of the transistor NP3 is coupled through a capacitor C1 to the inverting output of the amplifier 27 to receive the output voltage Voutn. Resistors R1 are coupled in series between the bases of the transistors NP3 and NP4, with an output common mode voltage Vocm forming at the center tap of the resistors R1. The resistors R1 and capacitors C1 form a high-pass filter. An adjustable resistor Rd is coupled between the inverting input and non-inverting output of the amplifier 27, and another adjustable resistor Rd is coupled between the non-inverting input and inverting output of the amplifier 27.

In operation, the amplifiers 23 and 26 boost the transconductance of the transistors NP1 and NP2. The resistors Rz and capacitors Cz form a pole in the transfer function (a zero in the input network), while the capacitors Cs and Rs form a zero in the transfer function. The differential current generated by the transistors NP1 and NP2 as a result of the resistors Rs flows through the resistors Rd, yielding a gain of:

$$\text{Gain} = \frac{Rd}{Rs} \frac{(1 + sCs * Rs)}{(1 + sCd * Rd)} \frac{1}{(1 + sCz * Rz)}$$

Note that in the above equation, Cd represents the load capacitance at the output of the VGA 15. The resistance values of Rz and Rs track one another over PVT variation because they are formed in the same technology (integrated into the same substrate using the same techniques). Similarly, Cz will generally track the gate to source capacitances of the transistors NP1 and NP2. This tracking eliminates concerns of gain peaking, because the pole $$\frac{1}{(1 + sCz * Rz)}$$

term cancels the zero (1+sCs*Rs).

If it is desired to increase the gain by reducing Rs, Rz is reduced accordingly pursuant to a calibration function to maintain the pole-zero cancelation and the according gain peaking elimination. Similarly, if it is desired to increase the gain by increasing Rd, after setting the value of Rs, Rz is increased to move the zero in the input network closer to the intermediate frequency to remove a gain drooping effect due to Rd*Cd.

To provide for the desired 72 dB of attenuation, the capacitance value of capacitors C1 and the resistance value of resistors R1 are selected dependent upon where the alias band is expected to be (and may be trimmed for precision), and therefore in the example shown, C1 and R1 are selected so as to filter frequencies higher than 75 MHz from the input of the differential amplifier formed by transistors NP3 and NP4. Therefore, if the differential signal represented by Voutp and Voutn has a component with a frequency of 75 MHz or greater, that component will be removed from the input of the amplifier 27 by the differential amplifier formed by transistors NP3 and NP4, and ultimately from the differential signal represented by Voutp and Voutn. Stated another way, the resistors R1 and capacitors C1 form a high-pass filter for the purpose of driving the gates of the differential amplifier formed by transistors NP3 and NP4 with only the high frequency components of the output signal represented by Voutp and Voutn, causing the differential amplifier to effectively act as a low-pass filter, removing signal components greater than the set high-pass filter frequency (here, as an example, 75 MHz) from the output signal represented by Voutp and Voutn.

The reason for the use of this feedback loop to perform low-pass filtering, as opposed to placing capacitors in parallel with the resistors Rd, is that the resulting pole would vary as Rd is varied to change the gain of the VGA 15 if capacitors had been placed in parallel with the resistors Rd to perform the desired filtering.

Therefore, this design of VGA not only eliminates the gain peaking problem of the prior art, but also achieves the 72 dB attenuation in the alias band of 75 MHz-100 MHz.

It should be appreciated here that the bandwidth of the amplifier formed by transistors NP3 and NP4 here is 75 MHz-100 MHz (thus, equal to the bandwidth of the alias band).

Figure 3:
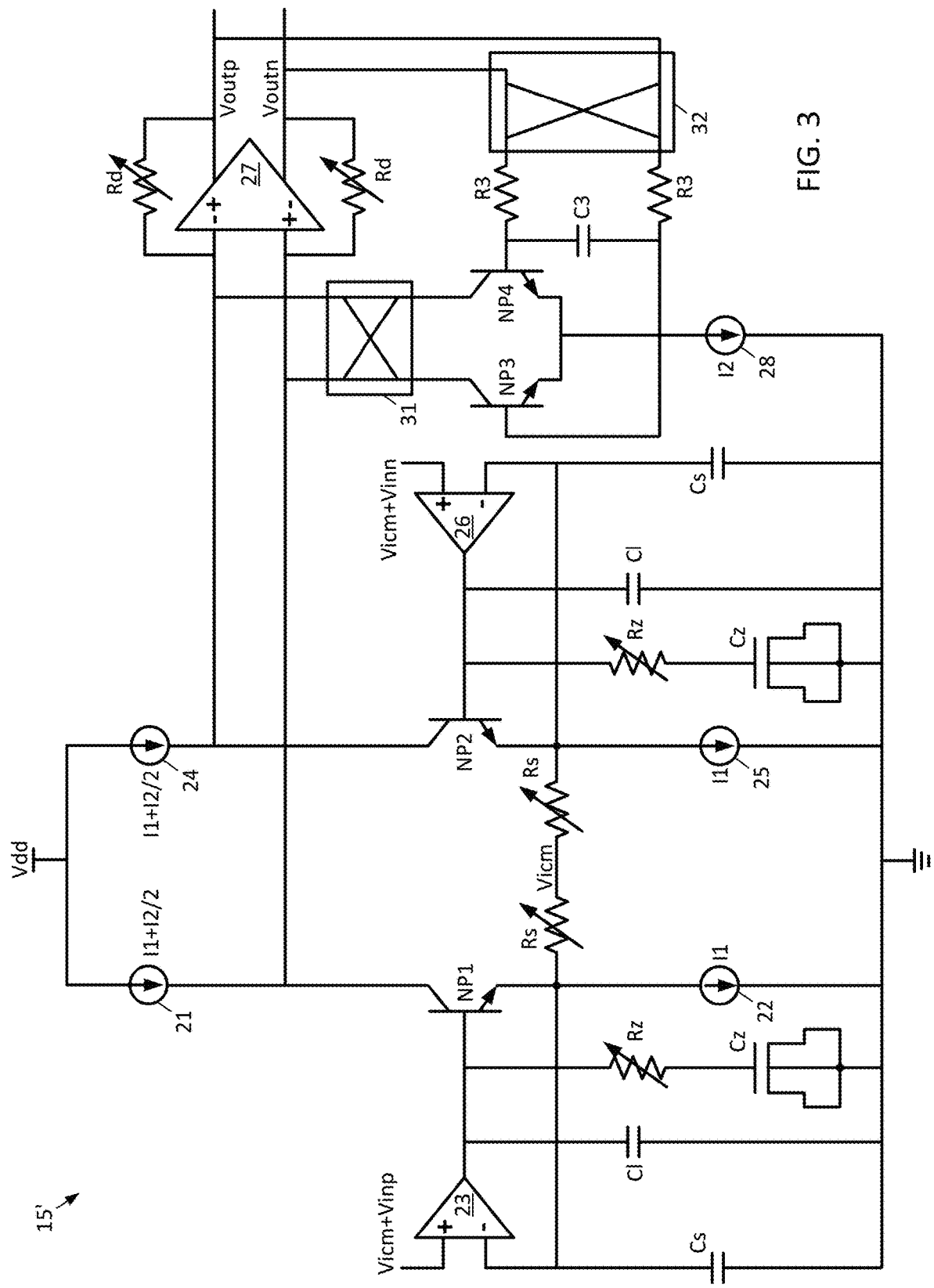
FIG. 3 is a schematic diagram of another embodiment of a voltage gain amplifier disclosed herein, such as may be used with the vehicular radar system of FIG. 1.

Now described with reference to FIG. 3 is a variant of the VGA 15' that not only eliminates high frequency gain peaking but also provides desired attenuation of the output signals Voutp and Voutn at 75 MHz. The VGA 15' has the same structure of the VGA 15 of FIG. 2, except for the connections to the transistors NP3 and NP4. Here, a 100 MHz chopper 31 (the frequency of the chopper 32 is 100 MHz to match the frequency of the ADC 17) is coupled between the collector of transistor NP3 and the collector of transistor NP1, and is coupled between the collector of transistor NP4 and the collector of transistor NP3.

Also, here, the filter between the output of the amplifier 27 and the input to the differential amplifier formed by transistors NP3 and NP4 is different than in the VGA 15, because it is a low-pass filter. Indeed, a capacitor C3 is coupled between the bases of the transistors NP3 and NP4. A resistor R3 is coupled between the base of transistor NP4 and a 100 MHz chopper 32 (the frequency of the chopper 32 is 100 MHz to match the frequency of the ADC 17), and another resistor R3 is coupled between the base of transistor NP3 and the chopper 32. The chopper 32 is coupled between the resistor R3 and the inverting output of the amplifier 27, and between the resistor R3 and the non-inverting output of the amplifier 27.

Note that the differential amplifier formed by the transistors NP3 and NP4 is to have a bandwidth greater than 75 MHz, since the signal driving its input will have a frequency of at least 75 MHz. The choppers 31 and 32 are used to reduce this bandwidth. The high frequency components of Voutp and Voutn that were at 75 MHz are therefore chopped by the chopper 32 to 25 MHz and 125 MHz. The low-pass filter formed by resistors R3 and capacitor C3 filters out the signal components at 125 MHz, so the bases of the transistors NP3 and NP4 receive only the 25 MHz signal components. The chopper 31 converts the frequencies of the signals sink by the transistors NP3 and NP4 back to 75 MHz to 100 MHz, which is the bandwidth of the alias band.

Thus, in the embodiment of FIG. 3, the bandwidth of the differential amplifier formed by transistors NP3 and NP4 in the embodiment of FIG. 3 is 0 MHz-25 MHz, as opposed to the 75 MHz-100 MHz bandwidth of the differential amplifier formed by transistors NP3 and NP4 in the embodiment of FIG. 3.

Figure 4:
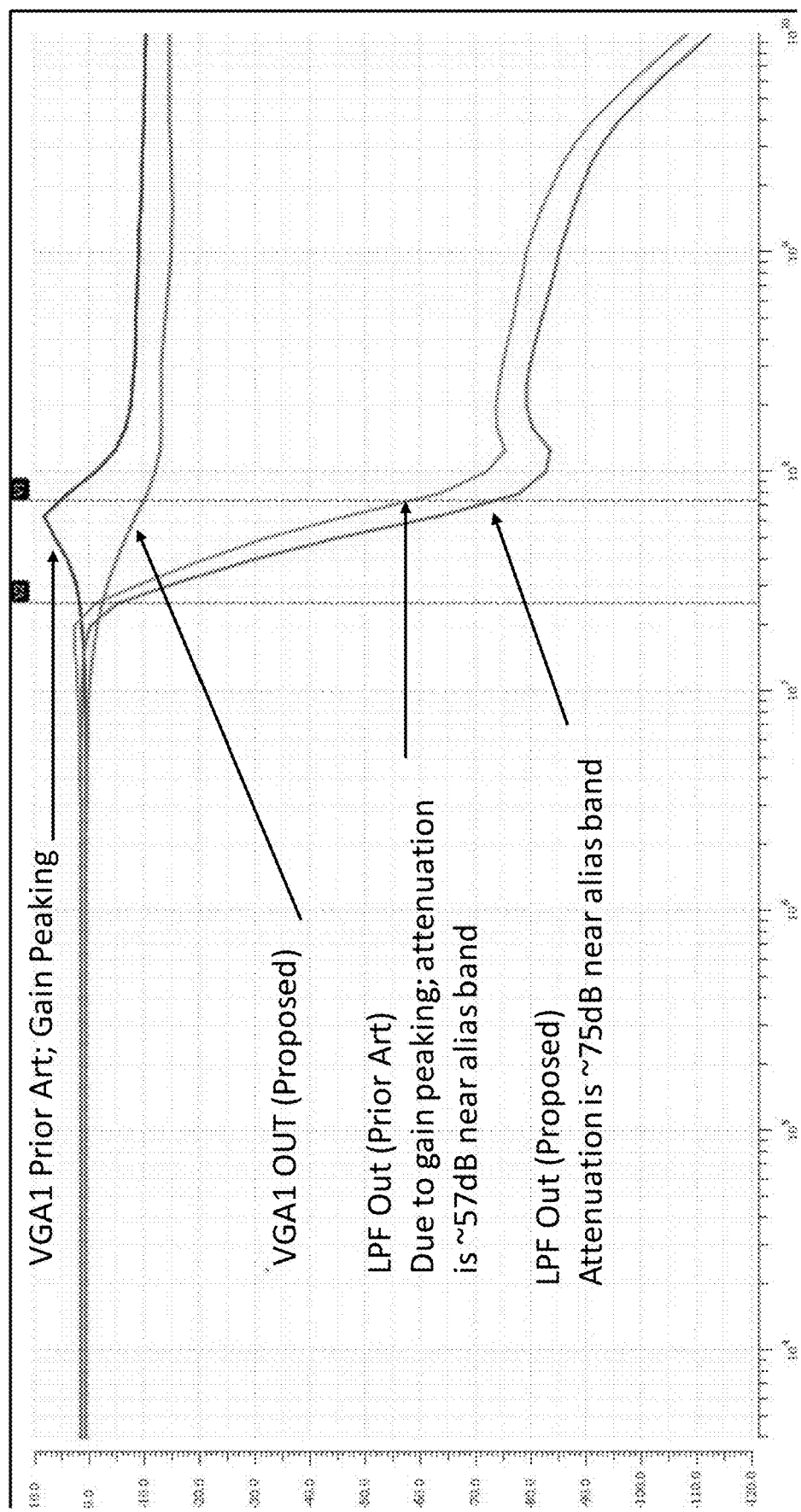
FIG. 4 is a graph comparing the response of the voltage gain amplifiers of FIGS. 2-3 over frequency to the response of a known prior art voltage gain amplifier.

The robust performance of the VGA 15' and VGA 15 can be seen in the graph of FIG. 4, where it can be seen that the prior art gain peaking is eliminated, and that the desired attenuation of 72 dB in alias band is achieved, and is in fact exceeded, as the attenuation in the alias band is 78 dB. From the graph of FIG. 4, it can be noticed that the gain remains relatively flat, and varies by less than 0.5 dB.

In the above descriptions, an intermediate frequency bandwidth of 25 MHz was used as an example, as was the sampling frequency of 100 MHz. The alias band of 75 MHz-100 MHz and the desired attenuation of 72 dB result from the selection of the intermediate frequency bandwidth and sampling frequency. Similarly, the frequency of the choppers result from the frequency of the alias band. It should be understood that these values are for the sake of example, and that any intermediate frequency bandwidth and sampling frequency may be used, and that the level of desired attenuation and the frequency of the choppers may be adjusted accordingly depending upon the intermediate frequency bandwidth and sampling frequency.

Figure 5:
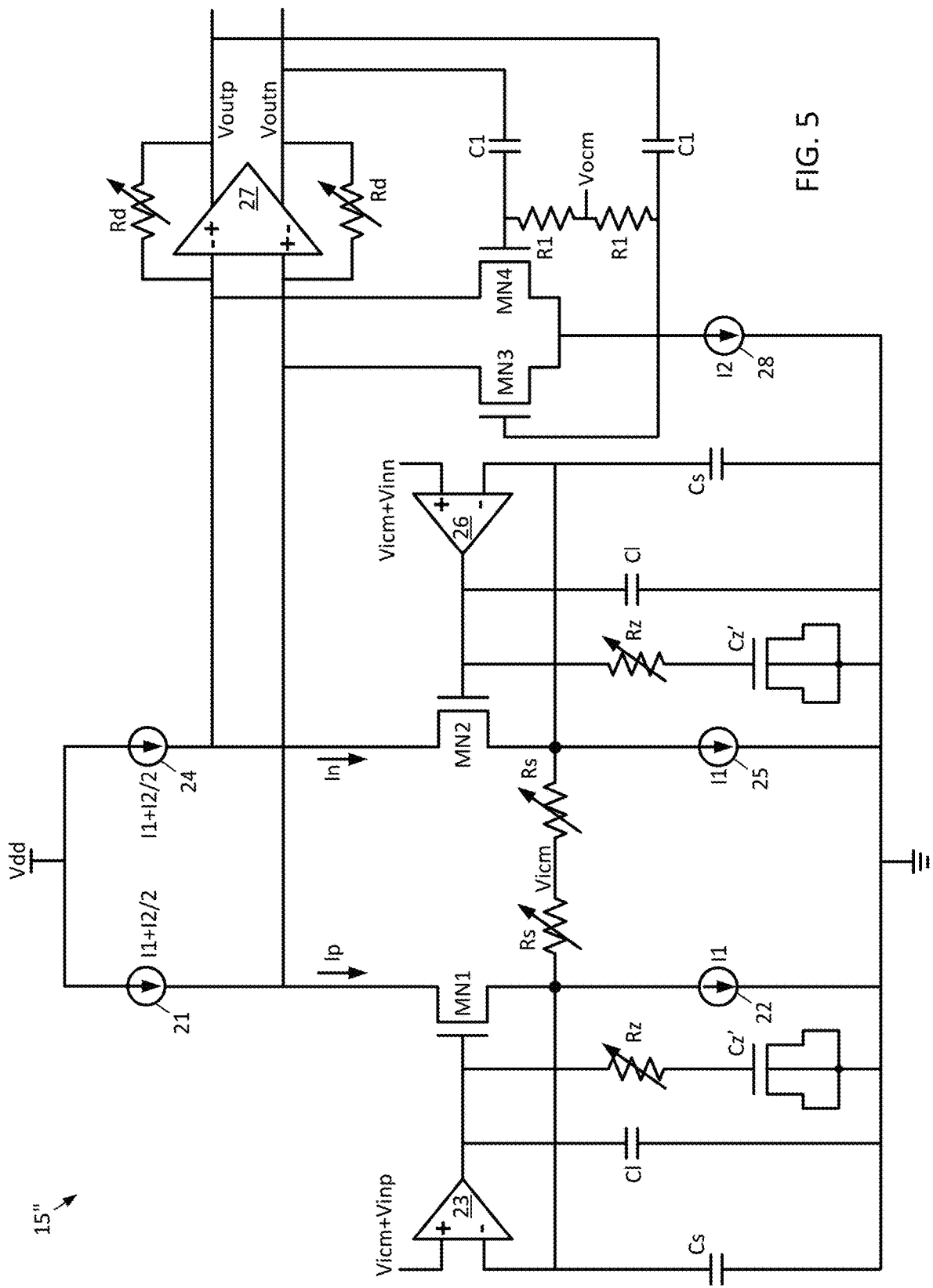
FIG. 5 is a schematic diagram of an embodiment of a voltage gain amplifier similar to that of FIG. 2, but with the bipolar junction transistors replaced with field effect transistors.

It should be understood that, although the example voltage gain amplifiers illustrated and described above have utilized bipolar junction transistors, field effect transistors may instead be used. For example, compare the VGA 15" of FIG. 5 to the VGA 15 of FIG. 2. Here, it can be seen that the transistors configured as capacitors Cz' are n-channel transistors, in which the NPN transistors NP1 and NP2 are replaced by n-channel transistors MN1 and MN2, and in which the NPN transistors NP3 and NP4 are replaced by n-channel transistors MN3 and MN4. The principles of operation of the VGA 15" remain the same as that of the VGA 15 described above.

Similarly, it should be understood that, although the example voltage gain amplifiers illustrated and described have utilized NPN bipolar junction transistors, they may instead utilize PNP bipolar junction transistors. For example, compare the VGA 15''' of FIG. 6 to the VGA 15' of FIG. 3. Here, it can be seen that the NPN transistors NP1 and NP2 are replaced by PNP transistors PN1 and PN2, and that the NPN transistors NP3 and NP3 are replaced by PNP transistors PN3 and PN4. In addition, note that the capacitor Cs is coupled between the inverting terminal of amplifier 23 and Vdd, that the capacitor C1 is coupled between the output terminal of amplifier 23 and Vdd, and that the series connected adjustable resistor Rz and transistor configured as a capacitor Cz are coupled in series between the output terminal of the amplifier 23 and Vdd. In addition, note that the current I1 from the current source 22 is sourced to the emitter of the PNP transistor PN1, and that the current I1+I2/2 from the current source 21 is sunk from the collector of the PNP transistor PN1 to ground. Similarly, note that the capacitor Cs is coupled between the inverting terminal of amplifier 26 and Vdd, that the capacitor C1 is coupled between the output terminal of amplifier 26 and Vdd, and that the series connected adjustable resistor Rz and transistor configured as a capacitor Cz are coupled in series between the output terminal of the amplifier 26 and Vdd. In addition, note that the current I1 from the current source 25 is sourced to the emitter of the PNP transistor PN2, and that the current I1+I2/2 from the current source 24 is sunk from the collector of the PNP transistor PN2 to ground. The principles of operation of the VGA 15''' remain the same as that of the VGA 15' described above.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
an amplifier having an input receiving an input signal and generating an output signal at an output, wherein the output signal includes desirable low frequency components and undesirable high frequency components;
a high-pass filter receiving the output signal and configured to filter out the desirable low frequency components and pass the undesirable high frequency components; and
a transistor circuit coupled between the input of the amplifier and ground, wherein the transistor circuit is driven by the undesirable high frequency components of the output signal passed by the high-pass filter such that the transistor circuit removes those undesirable high frequency components from the input signal;
wherein the input signal is a differential input signal comprised of first and second differential input signals;
wherein the output signal is a differential output signal comprised of first and second differential output signals, the first and second differential output signals including the desirable low frequency components and undesirable high frequency components;
wherein the amplifier has a first input receiving the first differential input signal and a second input receiving the second differential input signal, and has a first output outputting the first differential output signal and a second output outputting the second differential output signal;
wherein the transistor circuit comprises a differential amplifier formed by first and second transistors having their first conduction terminals respectively coupled to the first and second outputs of the amplifier, having their second conduction terminals coupled to a tail node, and having control terminals; and
wherein the high-pass filter comprises a filter resistance coupled between the control terminals of the first and second transistors, a first filter capacitance coupled between the control terminal of the first transistor and the first output of the amplifier, and a second filter capacitance coupled between the control terminal of the second transistor and the second output of the amplifier.

2. The circuit of claim 1, wherein the differential amplifier comprises:
a first NPN transistor having a collector coupled to the first input of the amplifier, an emitter coupled to the tail node, and a base coupled to the first output of the amplifier by the first filter capacitance;
a second NPN transistor having a collector coupled to the second input of the amplifier, an emitter coupled to the tail node, and a base coupled to the second output of the amplifier by the second filter capacitance; and
wherein the filter resistance is coupled between the bases of the first and second NPN transistors.

3. The circuit of claim 1, wherein the differential amplifier comprises:
a first n-channel transistor having a drain coupled to the first input of the amplifier, a source coupled to the tail node, and a gate coupled to the first output of the amplifier by the first filter capacitance;
a second n-channel transistor having a drain coupled to the second input of the amplifier, a source coupled to the tail node, and a gate coupled to the second output of the amplifier by the second filter capacitance; and
wherein the filter resistance is coupled between the gates of the first and second n-channel transistors.

4. The circuit of claim 1, wherein the tail node is coupled to ground through a current source.

5. The circuit of claim 1, further comprising an input differential amplifier formed by first and second input transistors having their first conduction terminals respectively generating the first and second differential input signals, having their second conduction terminals coupled to a tail, and having their control terminals respectively coupled to receive first and second input signals.

6. The circuit of claim 5, further comprising a first tunable RC circuit coupled between the control terminal of the first input transistor and ground, and a second tunable RC circuit coupled between the control terminal of the second input transistor and ground.

7. The circuit of claim 5, further comprising a first amplifier supplying the first input signal, and a second amplifier supplying the second input signal.

8. A circuit, comprising:
an amplifier having an input receiving an input signal and configured to generate an output signal at an output, wherein the output signal includes undesirable high frequency components;
a first chopper configured to receive the output signal and process the output signal, wherein the first chopper outputs a chopper output signal in which the undesirable high frequency components are downconverted to a lower frequency as well as upconverted to a higher frequency;
a low-pass filter configured to pass the undesirable high frequency components that were downconverted to the lower frequency while filtering out the undesirable high frequency components that were upconverted to the higher frequency;
a second chopper configured to upconvert the undesirable high frequency components that were downconverted to the lower frequency by the first chopper back to their original high frequency; and
a transistor circuit coupled to the second chopper, wherein the transistor circuit is driven by the downconverted undesirable high frequency components of the output signal passed by the low-pass filter such that the transistor circuit, through the second chopper, removes those upconverted undesirable high frequency components from the input signal.

9. The circuit of claim 8,
wherein the input signal is a differential input signal comprised of first and second differential input signals;
wherein the output signal is a differential output signal comprised of first and second differential output signals, the first and second differential output signals including the undesirable high frequency components;
wherein the amplifier has a first input receiving the first differential input signal and a second input receiving the second differential input signal, and has a first output outputting the first differential output signal and a second output outputting the second differential output signal;

wherein the transistor circuit comprises a differential amplifier formed by first and second transistors having their first conduction terminals respectively coupled to the first and second inputs of the amplifier through the second chopper, having their second conduction terminals coupled to a tail node, and having control terminals; and wherein the low-pass filter comprises a first filter resistance coupled between the first chopper and the control terminal of the first transistor, a second filter resistance coupled between the first chopper and the control terminal of the second transistor, and a filter capacitance coupled between the control terminals of the first and second transistors.

10. The circuit of claim 9, wherein the differential amplifier comprises:
a first NPN transistor having a collector coupled to the first input of the amplifier through the second chopper, an emitter coupled to the tail node, and a base coupled to the first chopper by the first filter resistance;
a second NPN transistor having a collector coupled to the second input of the amplifier through the second chopper, an emitter coupled to the tail node, and a base coupled to the first chopper by the second filter resistance; and
wherein the filter resistance is coupled between the bases of the first and second NPN transistors.

11. The circuit of claim 9, wherein the tail node is coupled to ground through a current source.

12. The circuit of claim 9, wherein the tail node is coupled to a supply voltage through a current source.

13. The circuit of claim 9, further comprising an input differential amplifier formed by first and second input transistors having their first conduction terminals respectively generating the first and second differential input signals, having their second conduction terminals coupled to a tail, and having their control terminals respectively coupled to receive first and second input signals.

14. The circuit of claim 13, further comprising a first tunable RC circuit coupled between the control terminal of the first input transistor and ground, and a second tunable RC circuit coupled between the control terminal of the second input transistor and ground.

15. The circuit of claim 13, further comprising a first amplifier supplying the first input signal, and a second amplifier supplying the second input signal.

16. The circuit of claim 9, further comprising an input differential amplifier formed by first and second input transistors having their second conduction terminals respectively generating the first and second differential input signals, having their first conduction terminals coupled to a tail, and having their control terminals respectively coupled to receive first and second input signals.

17. The circuit of claim 16, further comprising a first tunable RC circuit coupled between the control terminal of the first input transistor and a supply voltage, and a second tunable RC circuit coupled between the control terminal of the second input transistor and the supply voltage.

18. A voltage gain amplifier, comprising:
a first differential amplifier comprising:
a first NPN transistor having a collector coupled to a first output node, an emitter coupled to a first tail current source, and a base;
a second NPN transistor having a collector coupled to a second output node, an emitter coupled to a second tail current source, and a base;
a resistance coupled between the emitters of the first and second NPN transistors;
a first input amplifier having a non-inverting input coupled to a first differential input voltage, an inverting input coupled to ground, and an output coupled to the base of the first NPN transistor;
a first resistor and first capacitor coupled in series between the base of the first NPN transistor and ground;
a second input amplifier having a non-inverting input coupled to a second differential input voltage, an inverting input coupled to ground, and an output coupled to the base of the second NPN transistor; and
a second resistor and second capacitor coupled in series between the base of the second NPN transistor and ground;
a double ended differential amplifier having a non-inverting input coupled to the first output node, an inverting input coupled to the second output node, a non-inverting output coupled to the inverting input by a first feedback resistor, and an inverting output coupled to the non-inverting input by a second feedback resistor; and
a low-pass filter loop respectively coupled between the non-inverting and inverting outputs of the double ended differential amplifier and the inverting and non-inverting outputs of the double ended differential amplifier;
wherein the first resistor is substantially equal in resistance to the resistance coupled between the emitters of the first and second NPN transistors, and wherein the first capacitor is substantially equal in capacitance to an input capacitance of the first differential amplifier;
wherein the second resistor is substantially equal in resistance to the resistance coupled between the emitters of the first and second NPN transistors, and wherein the second capacitor is substantially equal in capacitance to an input capacitance of the first differential amplifier; and
wherein the first and second differential input voltages represent an input signal having an intermediate frequency, and wherein the low-pass filter loop serves to filter an alias bandwidth related to the intermediate frequency from the first and second output nodes without altering poles and zeroes of a transfer function of the voltage gain amplifier.

19. The voltage gain amplifier of claim 18, wherein the low-pass filter loop comprises:
a high-pass filter configured to pass signal components output by the double ended differential amplifier that are within the alias bandwidth, and block components output by the double ended differential amplifier that are within a bandwidth of the intermediate frequency; and
a second differential amplifier configured to receive outputs of the high-pass filter as input such that the second differential amplifier removes the signal components passed by the high-pass filter from the first and second output nodes.

20. The voltage gain amplifier of claim 19,
wherein the second differential amplifier comprises:
a third NPN transistor having a collector coupled to the first output node, an emitter coupled to a tail current source, and a base coupled to the non-inverting output of the double ended differential amplifier through a first filter capacitance;

a fourth NPN transistor having a collector coupled to the second output node, an emitter coupled to the tail current source, and a base coupled to the inverting output of the double ended differential amplifier through a second filter capacitance; and a filter resistance coupled between the bases of the third and fourth NPN transistors.

21. The voltage gain amplifier of claim 20, wherein the first differential amplifier comprises an active load coupled between a supply voltage and the first and second output nodes, with the active load being comprised of a first current source coupled between the supply voltage and the first output node and a second current source coupled between the supply voltage and the second output node; wherein the first and second tail current sources each sink a first current; wherein the tail current source of the second differential amplifier sinks a second current; and wherein the first current source sources a third current equal to a sum of the first current and one half the second current, and the second current source sources the third current.

22. The voltage gain amplifier of claim 18, further comprising:
a first chopper configured to downconvert signal components output by the double ended differential amplifier that are within the alias bandwidth to a lower frequency bandwidth;
a low-pass filter configured to pass low frequency components output by the first chopper to inputs of a second differential amplifier configured to sink currents containing the low frequency components output by the first chopper; and
a second chopper configured to upconvert the low frequency components in the currents sunk by the second differential amplifier such that the signal components output by the double ended differential amplifier that are within the alias band width are removed from the first and second output nodes.

23. The voltage gain amplifier of claim 22, wherein the second differential amplifier comprises:
a third NPN transistor having a collector coupled to the first output node, an emitter coupled to a tail current source, and a base coupled to the non-inverting output of the double ended differential amplifier through a first filter resistance;
a fourth NPN transistor having a collector coupled to the second output node, an emitter coupled to the tail current source, and a base coupled to the inverting output of the double ended differential amplifier through a second filter resistance; and
a capacitance resistance coupled between the bases of the third and fourth NPN transistors.

24. The voltage gain amplifier of claim 23, wherein the first differential amplifier comprises an active load coupled between a supply voltage and the first and second output nodes, with the active load being comprised of a first current source coupled between the supply voltage and the first output node and a second current source coupled between the supply voltage and the second output node; wherein the first and second tail current sources each sink a first current; wherein the tail current source of the second differential amplifier sinks a second current; and wherein the first current source sources a third current equal to a sum of the first current and one half the second current, and the second current source sources the third current.

25. The voltage gain amplifier of claim 18, wherein the first and second capacitors are formed by MOSFETS configured as transistors.

26. The voltage gain amplifier of claim 18, wherein the first differential amplifier comprises an active load coupled between a supply voltage and the first and second output nodes.

* * * * *